United States Patent
Alptekin et al.

(10) Patent No.: US 9,514,992 B2
(45) Date of Patent: Dec. 6, 2016

(54) UNIDIRECTIONAL SPACER IN TRENCH SILICIDE

(71) Applicant: International Business Machines Corporation, Armonk, NY (US)

(72) Inventors: Emre Alptekin, Fishkill, NY (US); Sameer H. Jain, Beacon, NY (US); Unoh Kwon, Fishkill, NY (US); Zhengwen Li, Scarsdale, NY (US); Hari V. Mallela, Poughquag, NY (US); Ayse M. Ozbek, Fishkill, NY (US); Cung D. Tran, Newburgh, NY (US); Reinaldo A. Vega, Wappingers Falls, NY (US); Richard S. Wise, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/706,288

(22) Filed: May 7, 2015

(65) Prior Publication Data

US 2016/0329251 A1    Nov. 10, 2016

(51) Int. Cl.
*H01L 29/78* (2006.01)
*H01L 21/8234* (2006.01)
*H01L 27/088* (2006.01)

(52) U.S. Cl.
CPC .......... *H01L 21/823468* (2013.01); *H01L 21/823431* (2013.01); *H01L 21/823443* (2013.01); *H01L 27/0886* (2013.01)

(58) Field of Classification Search
CPC .. H01L 27/0886; H01L 27/088; H01L 29/665; H01L 29/7839
See application file for complete search history.

(56) References Cited

U.S. PATENT DOCUMENTS

| | | | |
|---|---|---|---|
| 6,627,502 B1 | 9/2003 | Cho | |
| 6,642,566 B1 | 11/2003 | Mandelman et al. | |
| 8,415,250 B2 | 4/2013 | Alptekin et al. | |
| 2011/0127611 A1* | 6/2011 | Lee | H01L 29/41791 257/368 |
| 2012/0119302 A1 | 5/2012 | Pei et al. | |
| 2012/0285518 A1 | 11/2012 | De Souza et al. | |
| 2013/0320452 A1* | 12/2013 | Wann | H01L 21/823425 257/368 |

* cited by examiner

*Primary Examiner* — Jae Lee
(74) *Attorney, Agent, or Firm* — Reza Sarbakhsh (57) ABSTRACT

A semiconductor device includes a trench region in an interconnect level dielectric layer. A silicide layer is on the bottom of the trench region. Opposing minor sides of the trench region include a spacer layer, but the central portion of the trench region is substantially free from the spacer layer. The spacer layer is formed using an angled gas cluster ion beam.

16 Claims, 9 Drawing Sheets

UNIDIRECTIONAL SPACER IN TRENCH SILICIDE

FIELD OF THE INVENTION

The present invention relates generally to semiconductor devices, and more particularly, to a structure and method of forming a unidirectional spacer.

BACKGROUND

Semiconductor manufacturing steps for forming a semiconductor device, including a field effect transistor (FET) device and a fin field effect transistor (finFET) device, may include forming trench regions in a contact-level dielectric layer of the device, and forming contacts in the trench regions. The contacts may form electrical connections between various components of the semiconductor device. In one example, these connections may be local interconnects. There may be a direct or indirect interface between the contacts and a source/drain region of the semiconductor device.

As integrated circuits become increasingly complex, the need for increased packaging density, reduced device parasitics, and low resistivity interconnects increases. Silicide local interconnects have been utilized to reduce pitch requirements, device parasitic capacitance, and interconnect resistances.

A reduction in resistance and capacitance at an interface between a silicide layer and a source/drain region may improve device performance. For example, a relatively small interface area may reduce capacitance but increase resistance. Conversely, a relatively large interface area may reduce resistance but increase capacitance. Therefore, under the prior art, a tradeoff exists between resistance and capacitance; However, a limit to performance improvements from adjusting interface area exists resulting in a need for an improved structure and method of forming semiconductor devices to decrease both resistance and capacitance at an interface between the silicide layer and the source/drain region.

SUMMARY

According to an embodiment of the invention, a method for forming a semiconductor device includes forming first and second gate stacks on an upper surface of a semiconductor substrate. The first and second gate stacks are formed in parallel and are separated by an intermediate region. A dielectric layer is deposited on an upper surface of the first and second gate stacks; the dielectric layer comprises a trench region above at least a portion of the intermediate region. The trench region includes first and second parallel sidewalls, parallel to the first and second gate stacks, and third and fourth parallel sidewalls, perpendicular to the first and second gate stacks. A silicide layer is deposited within a bottom portion of the trench region. An angular gas cluster ion beam device deposits a spacer layer within at least the first and second portions of the trench region above and in direct contact with portions of the silicide layer. Sidewalls of the first portion of the trench region include portions of the first, second, and third sidewalls of the trench region, and sidewalls of the second portion of the trench region include portions of the first, second and fourth sidewalls of the trench region.

According to a further embodiment of the invention, a method for forming a semiconductor device includes forming first and second gate stacks on an upper surface of a semiconductor substrate. The first and second gate stacks are formed in parallel and are separated by an intermediate region. A dielectric layer is formed on an upper surface of the first and second gate stacks; the dielectric layer comprises a trench region above at least a portion of the intermediate region. The trench region includes first and second parallel sidewalls, parallel to the first and second gate stacks, and third and fourth parallel sidewalls, perpendicular to the first and second gate stacks. A silicide layer is deposited within a bottom portion of the trench region. A conformal spacer layer is formed on an upper surface of the semiconductor device including upper surfaces of the dielectric layer and the trench region. The spacer layer is doped in the first and second portions of the trench region with retardant gas ions using an angular gas cluster ion beam (GCIB) device. Sidewalls of the first portion of the trench region include portions of the first, second, and third sidewalls of the trench region, and sidewalls of the second portion of the trench region include portions of the first, second and fourth sidewalls of the trench region.

According to a further aspect of the invention, a semiconductor device includes first and second gate stacks on an upper surface of a semiconductor substrate. The first and second gate stacks are parallel to one another and are separated by an intermediate region. A dielectric layer is on an upper surface of the first and second gate stacks; the dielectric layer includes a trench region above at least a portion of the intermediate region. The trench region includes first and second parallel sidewalls, parallel to the first and second gate stacks, and third and fourth parallel sidewalls, perpendicular to the first and second gate stacks. A silicide layer is within a bottom portion of the trench region. A spacer layer is within at least the first and second portions of the trench region above and in direct contact with portions of the silicide layer. Sidewalls of the first portion of the trench region include portions of the first, second, and third sidewalls of the trench region, and sidewalls of the second portion of the trench region include portions of the first, second and fourth sidewalls of the trench region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A finFET device may include a plurality of fins formed in a wafer; a gate covering a portion of the fins, where the portion of the fins covered by the gate serves as a channel region of the device and portions of the fins extending out from under the gate may serve as source and drain regions of the device; and a pair of device spacers on opposite sides of the gate. It should be noted that the fins in the invention disclosed below may be fabricated using either a subtractive fin method, a replacement fin method, or any other method for forming a fin structure on a semiconductor substrate. Additionally, the gate stack may be formed using a fin replacement gate or gate last process flow, or a gate first process flow.

Embodiments of the present invention relate generally to semiconductor devices, and more specifically, to a structure and method of forming a unidirectional spacer. Although embodiments of the present invention may be described in relation to finFETs, it will be apparent to a person of ordinary skill in the art that they are equally applicable to planar devices.

According to an embodiment of the invention, a trench region is formed in a surface layer of a semiconductor device to serve as a contact opening. The semiconductor device may include a substrate layer, a gate stack, one or more source/drain regions, and a dielectric layer on the substrate layer, the gate stack, and the one or more source/drain regions. A trench region may be formed in the dielectric layer. A silicide layer may be formed in the trench region for various reasons including, for example, to reduce pitch requirements, device parasitics, and interconnect resistances.

In one embodiment of the invention, the silicide layer may be formed in the trench region after a replacement metal gate (RMG) process. Forming the silicide layer using post RMG may be desirable, for example, where the significant thermal budget needs in RMG modules may degrade silicide stability if deposited beforehand.

One consideration in forming the trench region and the silicide layer in the trench region may be that on the one hand, minimizing contact resistance requires complete opening of and forming silicide over the source/drain region, thereby maximizing contact length and reducing the silicide interface resistance. On the other hand, since external contact-to-gate parasitic capacitance is proportional to contact size, contact size needs to be minimized to limit parasitic capacitance. These opposing considerations provide a challenge that may compromise contact design.

Accordingly, embodiments of the invention provide for forming a full-strap contact to maximize the silicide contact area while forming a structure with spacers only on minor sidewalls of the contact region, and leaving the major axis of the contact length free of the spacer material. This method and structure reduce contact plug size while keeping the silicide contact length maximized. This technique maximizes the minor critical dimension of the contact, improves contact fill, and minimized contact stud resistance.

Figure 1A:
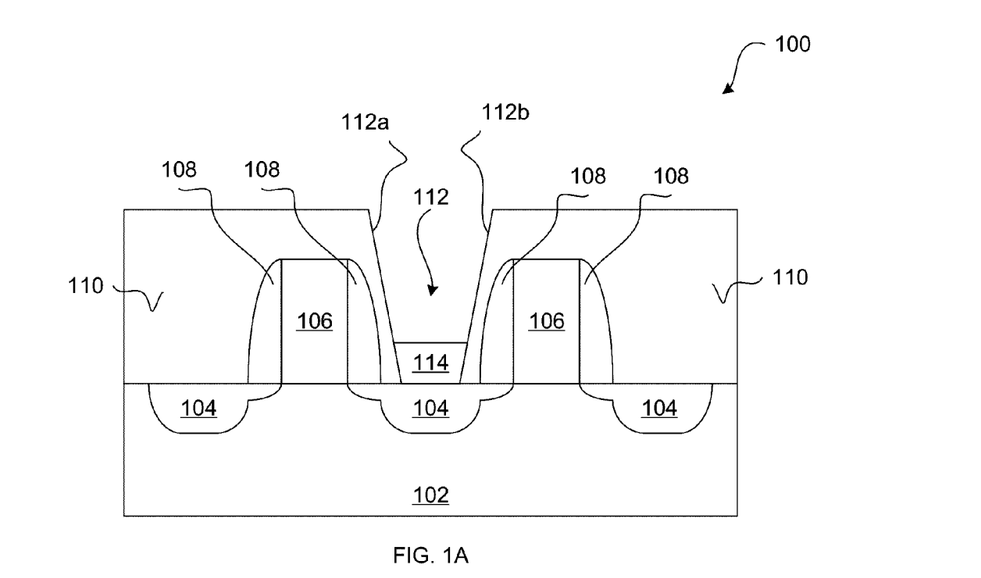
FIG. 1A depicts a front view of a semiconductor device, according to an embodiment of the invention.

Referring now to FIG. 1A, a front of view of a semiconductor device 100 (device 100) is shown. At this step of fabrication, device 100 may include one or more gate stacks (each may include a gate electrode 106, sidewall spacers 108, and other layers) formed over a semiconductor-on-insulator (SOI) substrate. It should be noted that the gate stack may be formed in any semiconductor substrate known to a person having ordinary skill in the art, including but not limited to, SOI substrates and bulk silicon substrates. However, an SOI substrate will be relied upon for purposes of the following description. Also, it should be noted that while this description refers to some components of the device 100 in the singular tense, more than one component may be depicted throughout the figures and like components are labeled with like reference characters. Device 100 may additionally include one or more source/drain regions 104 (hereinafter "S/D regions"), including one or more lightly doped diffusion (LDD) regions formed in substrate layer 102. In one embodiment, S/D regions 104 may be raised above the upper surface of substrate layer 102.

The SOI substrate employed in the present embodiment may include a bulk substrate, a buried dielectric layer (e.g., buried oxide) on top of the bulk substrate, and an SOI layer on top of the buried dielectric layer. The buried dielectric layer may electrically isolate the SOI layer from the bulk substrate. The bulk substrate may be composed of any known semiconductor material such as, for example, silicon, germanium, silicon-germanium alloy, silicon carbide, silicon-germanium carbide alloy, compound (e.g. III-V and II-VI) semiconductor materials, or any combination thereof. Non-limiting examples of compound semiconductor materials include gallium arsenide, indium arsenide, and indium phosphide. Typically the bulk substrate may be about, but is not limited to, several hundred microns thick. For example, the base substrate may have a thickness ranging from approximately 0.5 mm to approximately 1.5 mm, and ranges there between.

The buried dielectric layer may be composed of any known dielectric material. Non-limiting examples of dielectric materials include, for example, oxides, nitrides, oxynitrides, or any combination thereof. In addition, the buried dielectric layer may include crystalline or non-crystalline dielectric material. Moreover, the buried dielectric layer may be formed using any of several known methods. Non-limiting examples include, for example, ion implantation methods, thermal or plasma oxidation or nitridation methods, chemical vapor deposition methods, physical vapor deposition methods, or any combination thereof. In an embodiment, the buried dielectric layer may be about 150 nm thick. Alternatively, the buried dielectric layer may include a thickness ranging from approximately 10 nm to approximately 500 nm, and ranges there between.

The SOI layer may include any of the several semiconductor materials included in the bulk substrate. In general, the bulk substrate and the SOI layer may include either identical or different semiconducting materials with respect to chemical composition, dopant concentration and crystallographic orientation. In an embodiment, the bulk substrate and the SOI layer may include semiconducting materials that include different crystallographic orientations. Typically, the base substrate or the SOI layer may include a <110> crystallographic orientation and the other of the base substrate or the SOI layer includes a <100> crystallographic orientation. Typically, the SOI layer includes a thickness ranging from approximately 5 nm to approximately 100 nm, and ranges there between. Methods for forming the SOI layer are well known in the art. Non-limiting examples include chemical vapor deposition methods, physical vapor deposition methods, SIMOX (Separation by Implantation of Oxygen), wafer bonding, and ELTRAN® (Epitaxial Layer TRANsfer).

A dielectric layer 110 may be formed over upper surfaces of device 100 including, for example, the gate stacks (each including a gate electrode 106 and sidewall spacers 108). The dielectric layer 110 may be formed using any deposition method known in the art, such as, for example, chemical vapor deposition methods, physical vapor deposition methods, or any combination thereof. The dielectric layer 110 may be composed of a dielectric material, such as, for example, oxide, nitride, oxynitride, or any combination thereof. One or more portions of the dielectric layer 110 may be removed to form one or more trench regions 112. The one or more portions of the dielectric layer 110 may be removed by a conventional masking and etching process, such as, for example, reactive ion etching (RIE). One or more trench regions 112 may be formed in dielectric layer 110 in regions between two adjoining gate stacks and over S/D regions 104. Trench region 112 may include first and second opposing major sidewalls 112a and 112b. Trench region 112 may include a silicide layer 114 formed in a bottom portion of trench region 112. The silicide layer 114 may be formed using any deposition method known in the art, such as, for example, chemical vapor deposition methods, physical vapor deposition methods, or any combination thereof. The silicide layer 114 may be composed of any semiconductor compound with electropositive elements, such as for example, copper silicide, iron silicide, thorium silicide, hafnium silicide, or any combination thereof. Silicide layer 114 may form an interface between trench region 112 and S/D regions 104.

According to an embodiment, each gate stack may include a gate dielectric, a metal gate, and a gate cap. The gate dielectric may be formed after removal of a dummy gate during a replacement gate process flow. The gate dielectric can be formed by any deposition method known in the art, such as, for example, a chemical vapor deposition method, atomic layer deposition, evaporation, reactive sputtering, chemical solution deposition, or any combination thereof.

The gate dielectric may include a dielectric material including, such as, for example, oxide, nitride, oxynitride, silicate including metal silicates and nitrided metal silicates, or any combination thereof. In one embodiment, a gate dielectric (not shown) may include an oxide such as, for example, $SiO_2$, $HfO_2$, $ZrO_2$, $Al_2O_3$, $TiO_2$, $La_2O_3$, $SrTiO_3$, $LaAlO_3$, or any combination thereof. The physical thickness of the gate dielectric may vary, but typically may have a thickness ranging from approximately 0.5 nm to approximately 10 nm, and ranges there between. In a preferred embodiment, the gate dielectric may have a thickness ranging from approximately 0.5 nm to approximately 3 nm, and ranges there between.

The metal gate may be formed on upper of the gate dielectric. The metal gate may be deposited by any suitable technique known in the art, such as, for example, atomic layer deposition, a chemical vapor deposition method, a physical vapor deposition method, molecular beam deposition, pulsed laser deposition, liquid source misted chemical deposition, or any combination thereof. The metal gate may include, for example, crystalline silicon, amorphous silicon, zirconium, tungsten, tantalum, halfnium, titanium, aluminum, ruthenium, protactinium, metal oxide, metal carbide, metal nitride, transition metal aluminides (e.g. Ti3Al, ZrAl), TaC, TiC, TaMgC), or any combination thereof.

The gate cap may be formed on top of the metal gate using any suitable deposition technique known in the art, such as, for example, atomic layer deposition, a chemical vapor deposition method, a physical vapor deposition method, or any combination thereof. The gate cap typically is an insulator and may include may be composed of any dielectric material known in the art, such as, for example, Ni, $SiO_2$, and SiC, and generally, oxide, nitride, oxynitride, silicate including metal silicates and nitrided metal silicates, carbon-doped silicon, or any combination thereof.

Figure 1B:
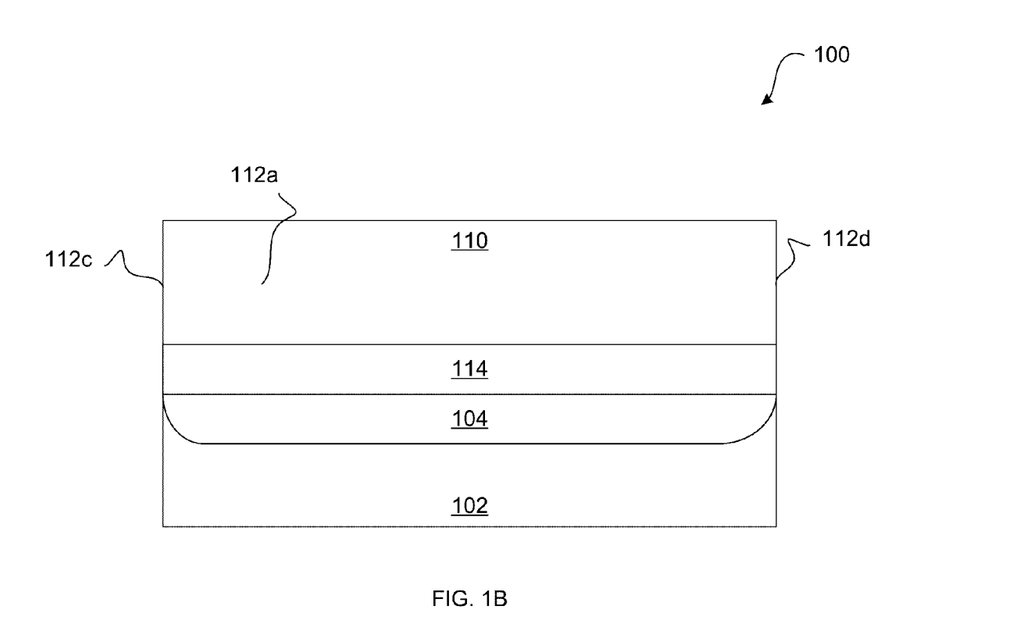
FIG. 1B depicts a side view of the semiconductor device of FIG. 1A, according to an embodiment of the invention.

Referring now to FIG. 1B, a side view of device 100 of FIG. 1A is shown. In this view, substrate layer 102, S/D regions 104, silicide layer 114, and dielectric layer 110 are shown. The area above silicide layer 114 corresponds to trench region 112 (FIG. 1A). An inner wall of dielectric layer 110 within the trench region 112 above and adjacent to silicide layer 114 corresponds to the first major sidewall 112a of trench region 112. An opposing sidewall (not shown) corresponds to the second major sidewall 112b of trench region 112.

Additionally, in this view, two opposing front and back minor sidewalls of trench region 112 (FIG. 1A) are shown. These correspond to front minor sidewall 112c and back minor sidewall 112d.

Figure 1C:
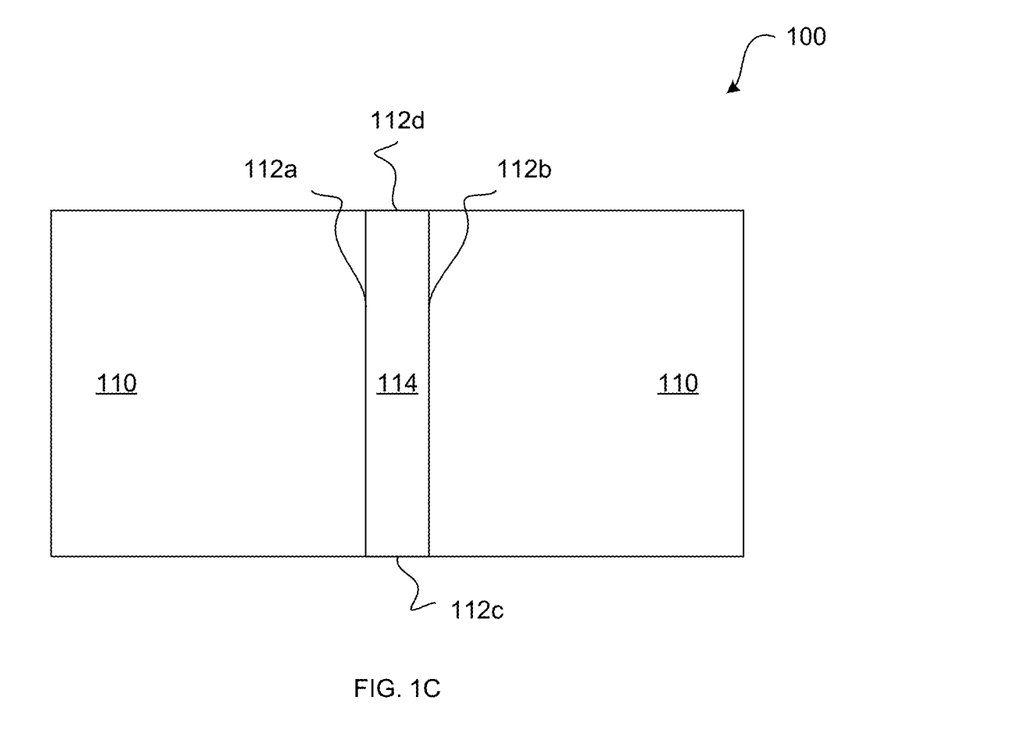
FIG. 1C depicts a top view of the semiconductor device of FIG. 1A, according to an embodiment of the invention.

Referring now to FIG. 1C, a top view of device 100 of FIG. 1A is shown. In this view, an upper surface of dielectric layer 110 is shown. An upper surface of the silicide layer 114 is shown at the bottom of trench region 112 (FIG. 1A). Trench region 112 has two sets of opposing sidewalls including major sidewalls 112a and 112b, and minor sidewalls 112c and 112d.

Figure 1D:
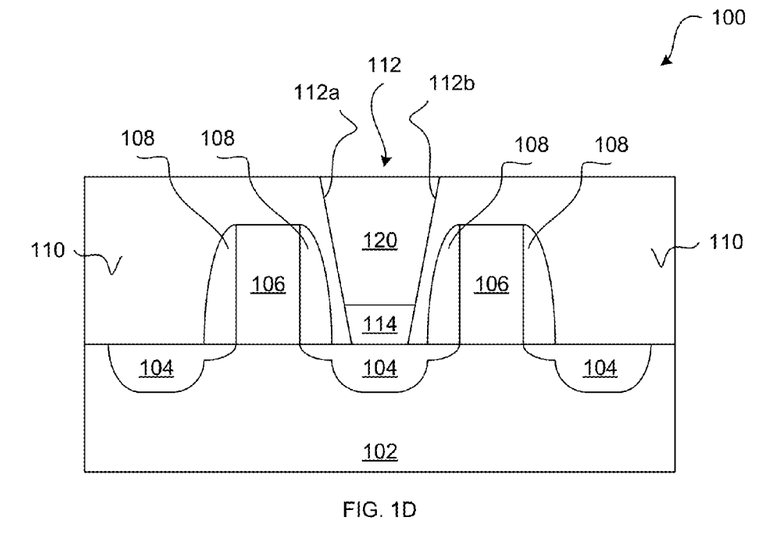
FIG. 1D depicts a front view of the semiconductor device of FIG. 1A subsequent to forming a unidirectional spacer layer, according to an embodiment of the invention.

Referring now to FIG. 1D, a front view of device 100 of FIG. 1A subsequent to forming a spacer layer 120 within the trench region 112, is shown. In an embodiment, the spacer layer 120 may be formed on an upper surface of the silicide layer 114. Components in FIG. 1D similar to those in FIG. 1A have been identically referenced. In addition to components of FIG. 1A, semiconductor device 100 in FIG. 1D includes spacer layer 120 in one or more portions of trench region 112 above the S/D regions 104.

The spacer layer 120 may be adjacent to and in contact with the first major sidewall 112a and the second major sidewall 112b. In an embodiment, a sidewall of the spacer layer 120 may be vertically aligned with either minor sidewall 112c, or minor sidewall 112d. In an embodiment, a sidewall of spacer layer 120 may be vertically aligned with the minor sidewall 112c and another sidewall of spacer layer 120 may be vertically aligned with the minor sidewall 112d. A central portion of the trench region may be substantially free of the spacer layer 120, such that spacer layer 120 may be formed in at least two portions on opposing sides of the trench region along the major sidewalls 112a/112b of the trench region. Each portion of spacer layer 120 may have a fourth sidewall adjacent to the central portion of the trench region.

According to an embodiment, spacer layer 120 may also be formed on upper surfaces of dielectric layer 110, in addition to the portions of trench region 112.

Figure 1E:
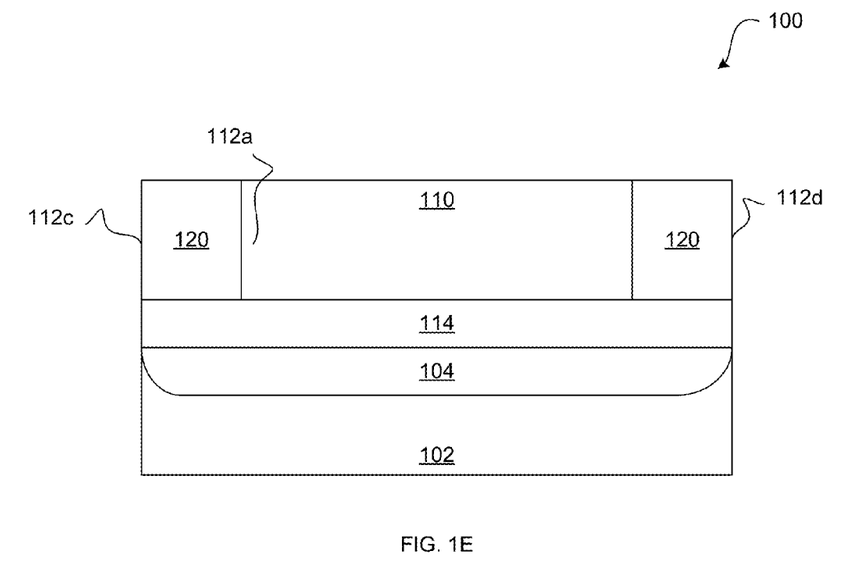
FIG. 1E depicts a side view of the semiconductor device of FIG. 1A subsequent to forming a unidirectional spacer layer, according to an embodiment of the invention.

Referring now to FIG. 1E, a side view of device 100 of FIG. 1A subsequent to forming spacer layer 120, is shown. Spacer layer 120 may be formed in at least two portions at opposing ends of trench region 112, wherein each portion of spacer layer 120 is adjacent to or in contact with at least three of the following sidewalls: the first major sidewall 112a, the second major sidewall 112b, and at least one minor sidewall, i.e., either minor sidewall 112c or minor sidewall 112d.

Figure 1F:
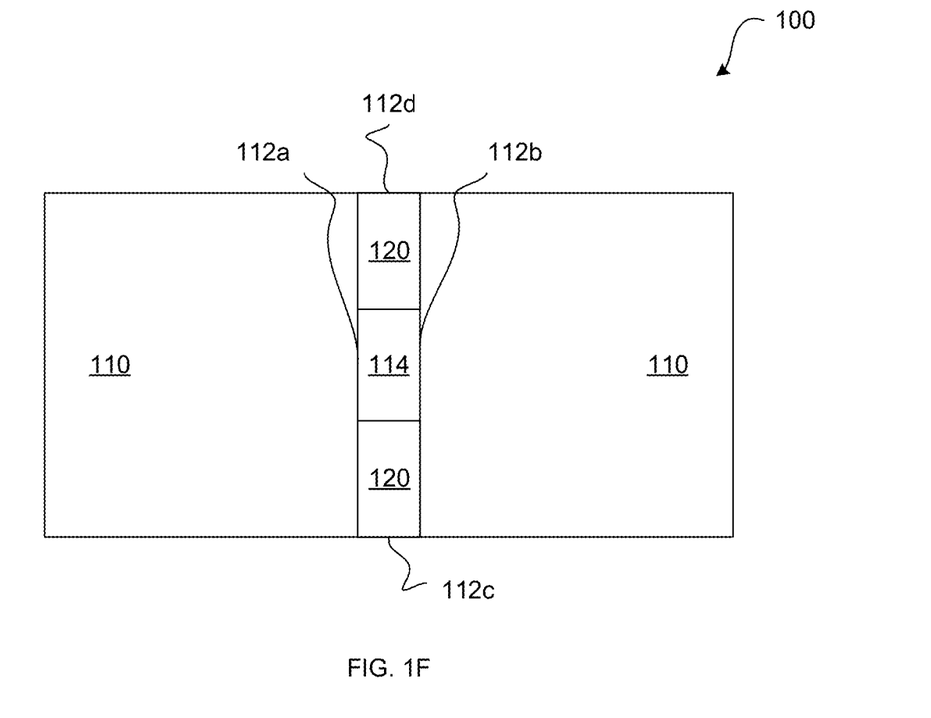
FIG. 1F depicts a top view of the semiconductor device of FIG. 1A subsequent to forming a unidirectional spacer layer, according to an embodiment of the invention.

Referring now to FIG. 1F, a top view of semiconductor device 100 of FIG. 1A subsequent to deposition of spacer layer 120 is shown. As described above, spacer layer 120 is formed in at least two portions, where each portion of spacer layer 120 is adjacent to or in contact with at least three sidewalls of trench region 112, as follows: the first major sidewall 112a, the second major sidewall 112b, and at least one minor sidewall, i.e., either minor sidewall 112c or minor sidewall 112d.

Referring now to FIGS. 1A-F, spacer layer 120 of FIGS. 1D-F may be formed as follows, according to an embodiment of the invention. In one step, semiconductor device 100 may be exposed to a gas cluster ion beam (GCIB) emitted by a GCIB device, such that the GCIB collides with the upper surface of semiconductor device 100 at an acute angle. In this step, spacer layer 120 may be formed on upper surfaces of dielectric layer 110 and upper surfaces of trench region 112. Since the deposition is angular, however, and because trench region 112 has a relatively high aspect ratio, spacer layer 120 material may be deposited on one end of trench region 112 without also being deposited on the opposing end of trench region 112. For example, during a first deposition step, semiconductor device 100 may be positioned perpendicularly to the GCIB device relative to the front side of semiconductor device 100 (the front side may be indicated, for example, by minor sidewall 112c). The GCIB may be positioned at an acute angle relative to the height of semiconductor device 100, such that the axis of impact intersects semiconductor device 100 at, for example, its top front side and exits semiconductor device 100 at, for example, its bottom back side). During this step, a first portion of spacer layer 120 may be formed on the back side of semiconductor device 100, whereby the first portion of spacer layer 120 is adjacent to or in contact with at least the following three sidewalls of trench regions 112: portions of major sidewalls 112a and 112b, and portions of minor sidewall 112d.

During a further step, semiconductor device 100 may be positioned against the GCIB such that the GCIB's angle of impact deposits material onto upper surfaces of semiconductor device 100 in the opposite direction. For example, if during the first deposition step, a first portion of spacer layer 120 is formed at the back end of trench region 112, then a second portion of spacer layer 120 may be deposited in the front end of trench region 112.

Forming the first and second portions of spacer layer 120 may be done in multiple steps that may be continuous or alternating. For example, several deposition passes may be made to form the first portion, and several other deposition passes may be made to form the second portion. In another embodiment, deposition passes may be made alternately.

According to an embodiment of the invention, upon depositing first and second portions of spacer layer 120 within trench region 112, conventional etching techniques such as reactive ion etching (RIE) may be used to remove unwanted portions of spacer layer 120 from regions of semiconductor device 100 other than those regions where spacer layer 120 is desired. For example, the deposition steps described above may deposit spacer material onto upper surfaces of dielectric layer 110 and onto the bottom surface of trench regions 112 (in the depicted embodiments, this bottom surface of trench region 112 may be covered by the upper surface of silicide layer 114). These unwanted portions may be removed from dielectric layer 110 and from middle sections of trench region 112 without removing them from the first and second portions of spacer layer 120, as depicted in FIGS. 1D-F.

It will be understood by a person of ordinary skill in the art that although descriptions of embodiments of the invention include references to spacer layer 120 being adjacent to or in contact with one or more sidewalls, it is not necessary that such sidewalls be adjacent to or in contact with spacer layer 120 along their entirety. For example, spacer layer 120 may be in contact or adjacent to only portions of such sidewalls, including major and minor sidewalls.

With continued reference to FIGS. 1A-F, according to a further embodiment of the invention, a conformal spacer film layer may be deposited onto exposed upper surfaces of semiconductor device 100. Subsequent to this step, dielectric layer 110 and upper surfaces of trench region 112 (including, for example, an upper surface of silicide layer 114) may be covered by the deposited spacer film layer.

Thereafter, first and second portions of the deposited spacer film layer may be angularly doped using a GCIB, in the same manner as described above in connection with angular deposition of spacer film material. For example, in one step, a first portion of the deposited spacer film layer adjacent to or in contact with portions of the two major sidewalls 112a and 112b, and portions of minor sidewall 112c (the front side of semiconductor device 100) may be doped using carbon or fluorine gas ions to retard the etch rate of the spacer film layer at that first portion. Subsequently, a second portion of the deposited spacer film layer adjacent to or in contact with portions of the two major sidewalls 112a and 112b, and portions of minor sidewall 112d (the back side of semiconductor device 100) may be doped using carbon or fluorine gas ions to retard the etch rate of the spacer film layer at that second portion. In one embodiment, the minor sidewall 112d may have a doping dose ranging from approximately $5.0 \times 10^{13}$ cm$^{-2}$ to approximately $5.0 \times 10^{15}$ cm$^{-2}$.

Subsequently, a portion of the spacer film layer may be removed using a conventional masking and etching process, such as, for example, RIE. Un-doped portions of spacer film layer may be etched more quickly than doped portions. Accordingly, the spacer film layer may be removed from upper surfaces of semiconductor device 100 including, for example, dielectric layer 110 and central portions of trench region 112, including along central portions of major sidewalls 112a and 112b, while the spacer film layer remains on first and second opposing portions of trench region 112, as described in connection with FIGS. 1D-F, above.

Additional details of a GCBI device and its methods of operation to manufacture the above described semiconductor device 100 are discussed in greater detail with respect to FIG. 3, below.

Figure 2A:
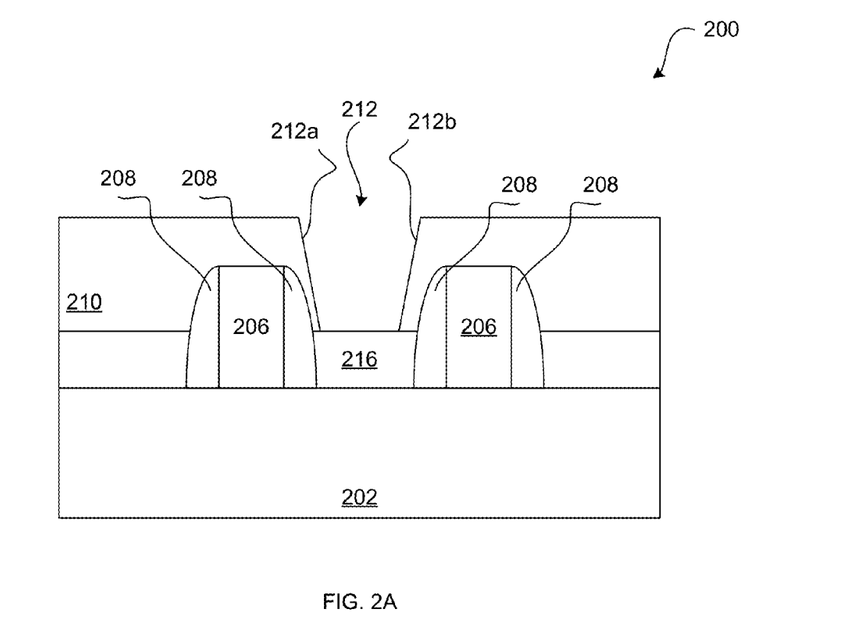
FIG. 2A depicts a front view of a fin field effect transistor (finFET) device, according to an embodiment of the invention.

Referring now to FIG. 2A, a front of view of a fin field effect transistor (finFET) device 200 (finFET 200) is shown. Generally, a finFET device may include a plurality of fins formed in a wafer; a gate covering a portion of the fins, where the portion of the fins covered by the gate serves as a channel region of the device and portions of the fins extending out from under the gate may serve as source and drain regions of the device; and a pair of device spacers on opposite sides of the gate. It should be noted that the fins in the invention disclosed below may be fabricated using either a subtractive fin method, a replacement fin method, or any other method for forming a fin structure on a semiconductor substrate. Additionally, the gate stack may be formed using a fin replacement gate or gate last process flow, or a gate first process flow.

At this step of fabrication, finFET 200 may include one or more gate stacks (each may include a gate electrode 206, sidewall spacers 208, and other layers) formed over base layer 202, including, for example, a semiconductor-on-insulator (SOI) substrate. Base layer 202 may be, in one embodiment, similar to substrate layer 102 (FIGS. 1A-F). It should be noted that while this description refers to some components of the finFET 200 in the singular tense, more than one component may be depicted throughout the figures and like components are labeled with like reference characters. finFET 200 may additionally include one or more lightly doped diffusion (LDD) regions formed in one or more fins 216.

A dielectric layer 210 may be formed over upper surfaces of finFET 200 including, for example, the gate stacks (each including a gate electrode 206 and sidewall spacers 208). The dielectric layer 210 may be formed using any deposition process known in the art, such as, for example, chemical vapor deposition methods, physical vapor deposition methods, or any combination thereof. One or more portions of the dielectric layer 210 may be removed to form one or more trench regions 212 (hereinafter "trench regions"). The one or more portions of the dielectric layer 110 may be removed by a conventional masking and etching process, such as, for example, reactive ion etching (RIE). Trench regions 212 may be formed between two adjoining gate stacks and over fins 216. Trench regions 212 may include first and second opposing major sidewalls 212a and 212b. Trench region 212 may include a silicide layer (not shown) formed in a bottom portion of trench region 212. The silicide layer may form an interface between trench region 212 and fins 216.

The gate stacks may be formed according to any known method in the art including, for example, a replacement metal gate process (RMG).

Figure 2B:
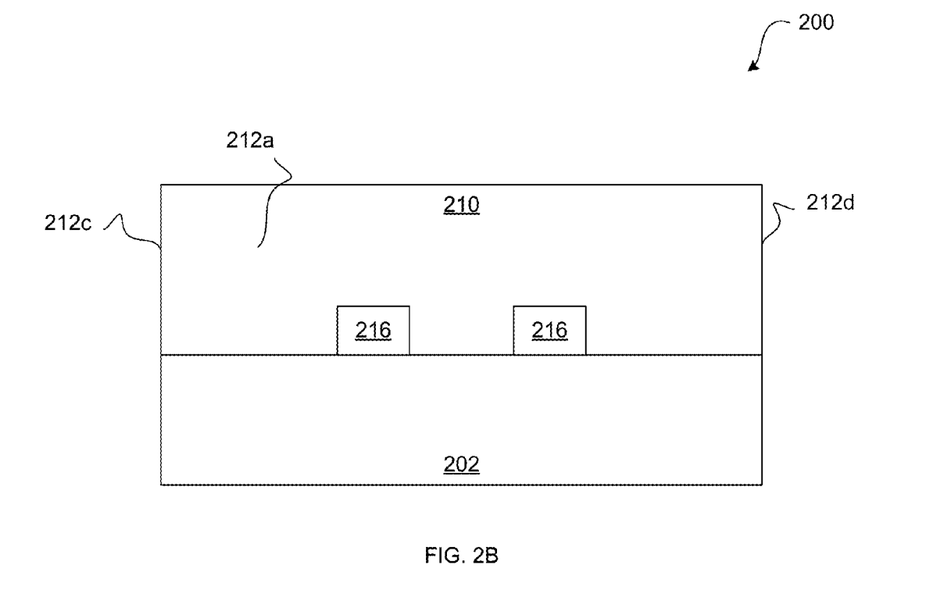
FIG. 2B depicts a side view of the finFET device of FIG. 2A, according to an embodiment of the invention.

Referring now to FIG. 2B, a side view of finFET 200 of FIG. 2A is shown. In this view, base layer 202, one or more fins 216, and dielectric layer 210 are shown. The area above base layer 202 and the area surrounding exposed regions of fins 216 and above fins 216 corresponds to trench region 212 (FIG. 2A). An inner surface of dielectric layer 210 above and adjacent to silicide layer 114 corresponds to the first major sidewall 212a of trench region 212.

Additionally, in this view, two opposing front and back minor sidewalls of trench region 212 (FIG. 2A) are shown. These correspond to front minor sidewall 212c and back minor sidewall 212d.

Figure 2C:
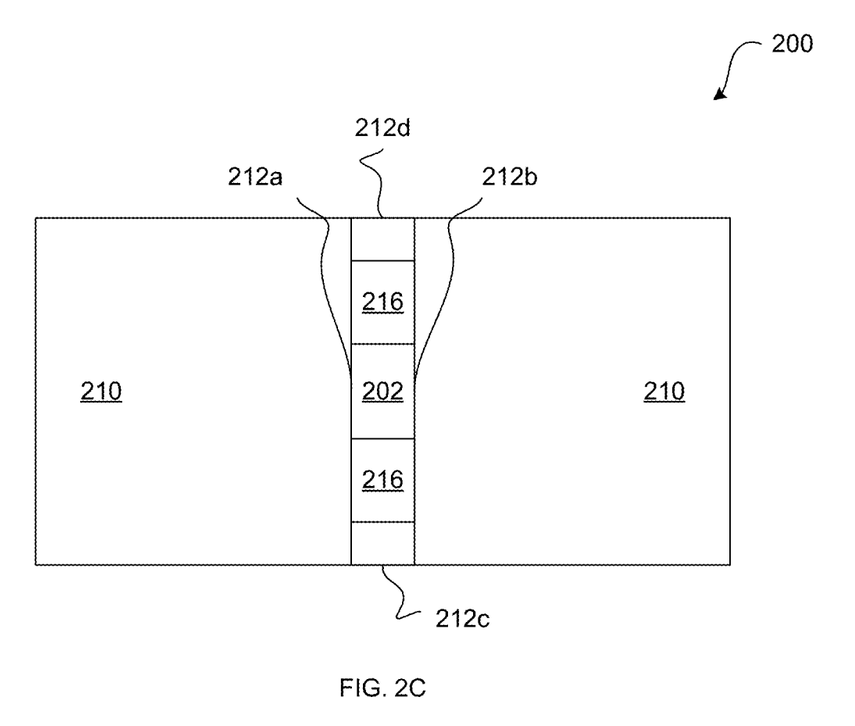
FIG. 2C depicts a top view of the finFET device of FIG. 2A, according to an embodiment of the invention.

FIG. 2C depicts a top view of finFET 200 of FIG. 2A. In this view, dielectric layer 210 is shown. Base layer 202 is shown at the bottom of trench region 212 (trench layer 212 is not labeled). Trench layer 212 has two sets of opposing sidewalls including major sidewalls 212a and 212b, and minor sidewalls 212c and 212d.

Figure 2D:
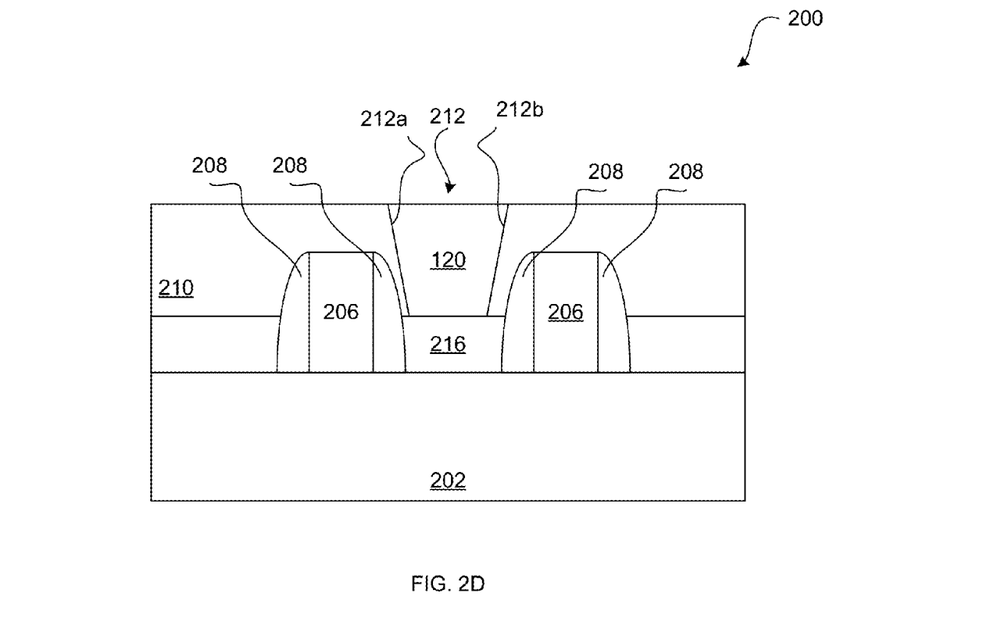
FIG. 2D depicts a front view of the finFET device of FIG. 2A subsequent to forming a unidirectional spacer layer, according to an embodiment of the invention.

FIG. 2D depicts a front view of the semiconductor device of FIG. 2A subsequent to forming a spacer layer in portions of trench layer 212. Components in FIG. 2D similar to those in FIG. 2A have been identically referenced. In addition to components of FIG. 2A, finFET 200 in FIG. 2D includes spacer layer 220 in one or more portions of trench layer 212 above the fin(s) 216. In one embodiment, spacer layer 220 may be formed above a silicide layer (not shown).

Figure 2E:
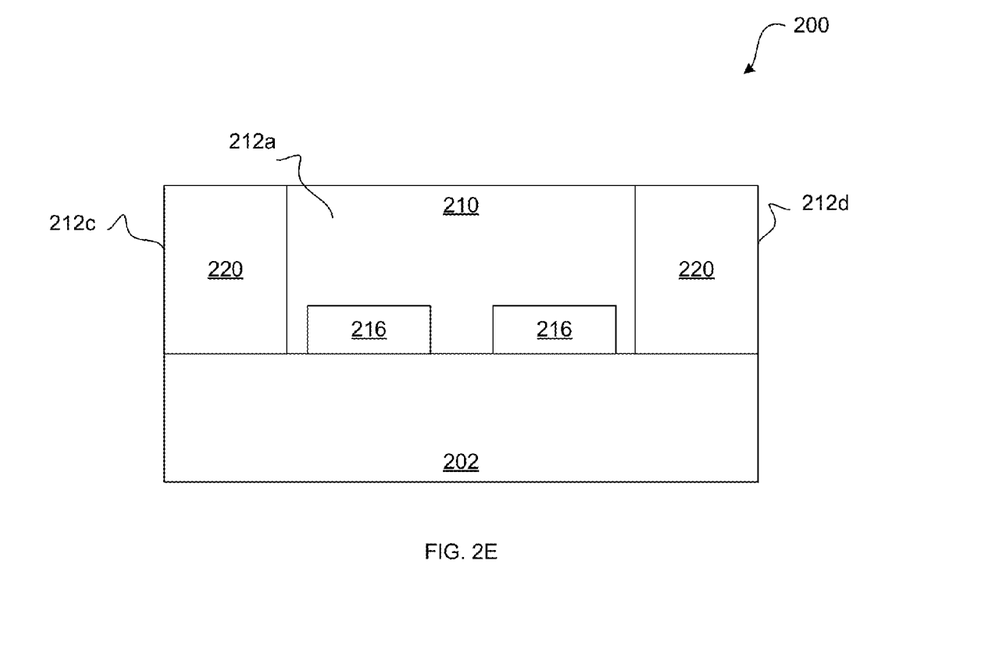
FIG. 2E depicts a side view of the finFET device of FIG. 2A subsequent to forming a unidirectional spacer layer, according to an embodiment of the invention.

Spacer layer 220 may be formed in two parts at opposite ends of trench region 212, such that for each part of spacer layer 220, it is adjacent to and/or in contact with at least three sidewalls of trench region 212: the first major sidewall 212a, the second major sidewall 212b, and at least one minor sidewall, i.e., either minor sidewall 212c or minor sidewall 212d (shown more clearly in FIG. 2E).

FIG. 2E depicts a side view of finFET 200 of FIG. 2A subsequent to forming spacer layer 220, according to an embodiment of the invention. Spacer layer 220 is formed in at least two portions at opposing ends of trench region 212, wherein each portion of spacer layer 220 is adjacent to or in contact with at least three of the following sidewalls: the first major sidewall 212a, the second major sidewall 212b, and at least one minor sidewall, i.e., either minor sidewall 212c or minor sidewall 212d.

Figure 2F:
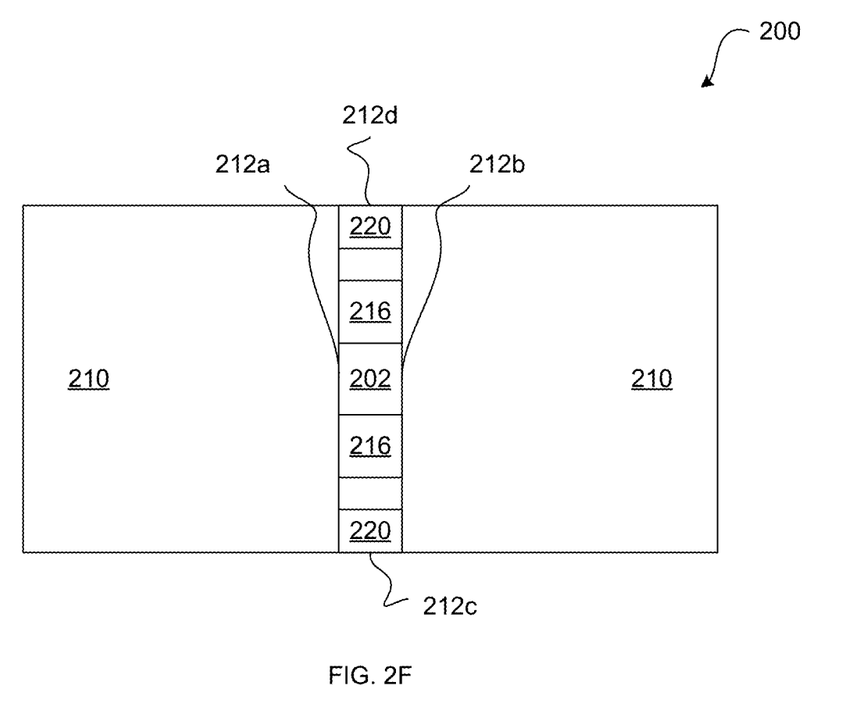
FIG. 2F depicts a top view of the finFET device of FIG. 2A subsequent to forming a unidirectional spacer layer, according to an embodiment of the invention.

FIG. 2F depicts a top view of finFET 200 of FIG. 2A subsequent to deposition of spacer layer 220, according to an embodiment of the invention. As described above, spacer layer 220 is formed in at least two portions, where each portion of spacer layer 220 is adjacent to or in contact with at least three sidewalls of trench region 212, as follows: the first major sidewall 212a, the second major sidewall 212b, and at least one minor sidewall, i.e., either minor sidewall 212c or minor sidewall 212d.

Referring now to FIGS. 2A-F, spacer layer 220 of FIGS. 2D-F may be formed as follows, according to an embodiment of the invention. In one step, finFET 200 may be exposed to a gas cluster ion beam (GCIB) emitted by a GCIB device, such that the GCIB collides with the upper surface of finFET 200 at an acute angle. In this step, spacer layer 220 may be formed on upper surfaces of dielectric layer 210 and upper surfaces of trench region 212. Since the deposition is angular, however, and because trench region 212 has a relatively high aspect ratio, spacer layer 220 material may be deposited on one end of trench region 212 without also being deposited on the opposing end of trench region 212. For example, during a first deposition step, finFET 200 may be positioned perpendicularly to the GCIB device relative to the front side of finFET 200 (the front side may be indicated, for example, by minor sidewall 212c). The GCIB may be positioned at an acute angle relative to the height of finFET 200, such that the axis of impact intersects finFET 200 at, for example, its top front side and exits finFET 200 at, for example, its bottom back side). During this step, a first portion of spacer layer 220 may be formed on the back side of finFET 200, whereby the first portion of spacer layer 220 is adjacent to or in contact with at least the following three sidewalls of trench regions 212: portions of major sidewalls 212a and 212b, and portions of minor sidewall 212d.

During a further step, finFET 200 may be positioned against the GCIB such that the GCIB's angle of impact deposits material onto upper surfaces of finFET 200 in the opposite direction. For example, if during the first deposition step, a first portion of spacer layer 220 is formed at the back end of trench region 212, then a second portion of spacer layer 220 may be deposited in the front end of trench region 212.

Forming the first and second portions of spacer layer 220 may be done in multiple steps that may be continuous or alternating. For example, several deposition passes may be made to form the first portion, and several other deposition passes may be made to form the second portion. In another embodiment, deposition passes may be made alternately.

According to an embodiment of the invention, upon depositing first and second portions of spacer layer 220 within trench region 212, conventional etching techniques such as reactive ion etching (RIE) may be used to remove unwanted portions of spacer layer 220 from regions of finFET 200 other than those regions where spacer layer 220 is desired. For example, the deposition steps described above may deposit spacer material onto upper surfaces of dielectric layer 210 and onto the bottom surface of trench regions 212 (in the depicted embodiments, this bottom surface of trench region 212 may be covered by the upper surface of a silicide layer). These unwanted portions may be removed from dielectric layer 210 and from middle sections of trench region 212 without removing them from the first and second portions of spacer layer 220, as depicted in FIGS. 2D-F.

It will be understood by a person of ordinary skill in the art that although descriptions of embodiments of the invention include references to spacer layer 220 being adjacent to or in contact with one or more sidewalls, it is not necessary that such sidewalls be adjacent to or in contact with spacer layer 220 along their entirety. For example, spacer layer 220 may be in contact or adjacent to only portions of such sidewalls, including major and minor sidewalls.

With continued reference to FIGS. 2A-F, according to a further embodiment of the invention, a conformal spacer film layer may be deposited onto exposed upper surfaces of finFET 200. Subsequent to this step, dielectric layer 210 and upper surfaces of trench region 212 (including, for example, an upper surface of silicide layer 114) may be covered by the deposited spacer film layer.

Thereafter, first and second portions of the deposited spacer film layer may be angularly doped using a GCIB, in the same manner as described above in connection with angular deposition of spacer film material. For example, in one step, a first portion of the deposited spacer film layer adjacent to or in contact with portions of the two major sidewalls 212a and 212b, and portions of minor sidewall 212c (the front side of finFET 200) may be doped using Carbon or Fluorine gas ions to retard the etch rate of the spacer film layer at that first portion. Subsequently, a second portion of the deposited spacer film layer adjacent to or in contact with portions of the two major sidewalls 212a and 212b, and portions of minor sidewall 212d (the back side of finFET 200) may be doped using Carbon or Fluorine gas ions to retard the etch rate of the spacer film layer at that second portion.

Subsequently, the spacer film layer may be etched using any known technique in the art, such as RIE. Un-doped portions of spacer film layer are etched more quickly than doped portions. Accordingly, the spacer film layer may be removed from upper surfaces of finFET 200 including, for example, dielectric layer 210 and central portions of trench region 212, including along central portions of major sidewalls 212a and 212b, while the spacer film layer remains on first and second opposing portions of trench region 212, as described in connection with FIGS. 2D-F, above.

Additional details of a GCBI device and its methods of operation to manufacture the above described finFET 200 are discussed in greater detail with respect to FIG. 3, below.

Referring now generally to FIGS. 1A-F and 2A-F, the spacer film material deposited onto the devices described may be made, in one embodiment, from one material such as an oxide, nitride, or a low-K spacer material. In another embodiment, it may be made from a combination of different materials such as a low-K spacer which may be used to reduce contact to gate capacitance, followed by using a liner preclean resistant material, such as a nitride.

In another embodiment, spacers may be formed on major sidewalls of trench regions to reduce minor critical dimensions while keeping major critical dimensions the same. This may be achieved, for example, by forming sidewall spacers or combined with a conventional spacer process to further reduce minor critical dimension.

According to an embodiment of the invention, the spacer layers 120/220 may have a thickness of approximately 10 nm; the critical dimension of the gate structure may be approximately 20 nm; and the contact opening may be approximately 15 to 25 nm.

Figure 3:
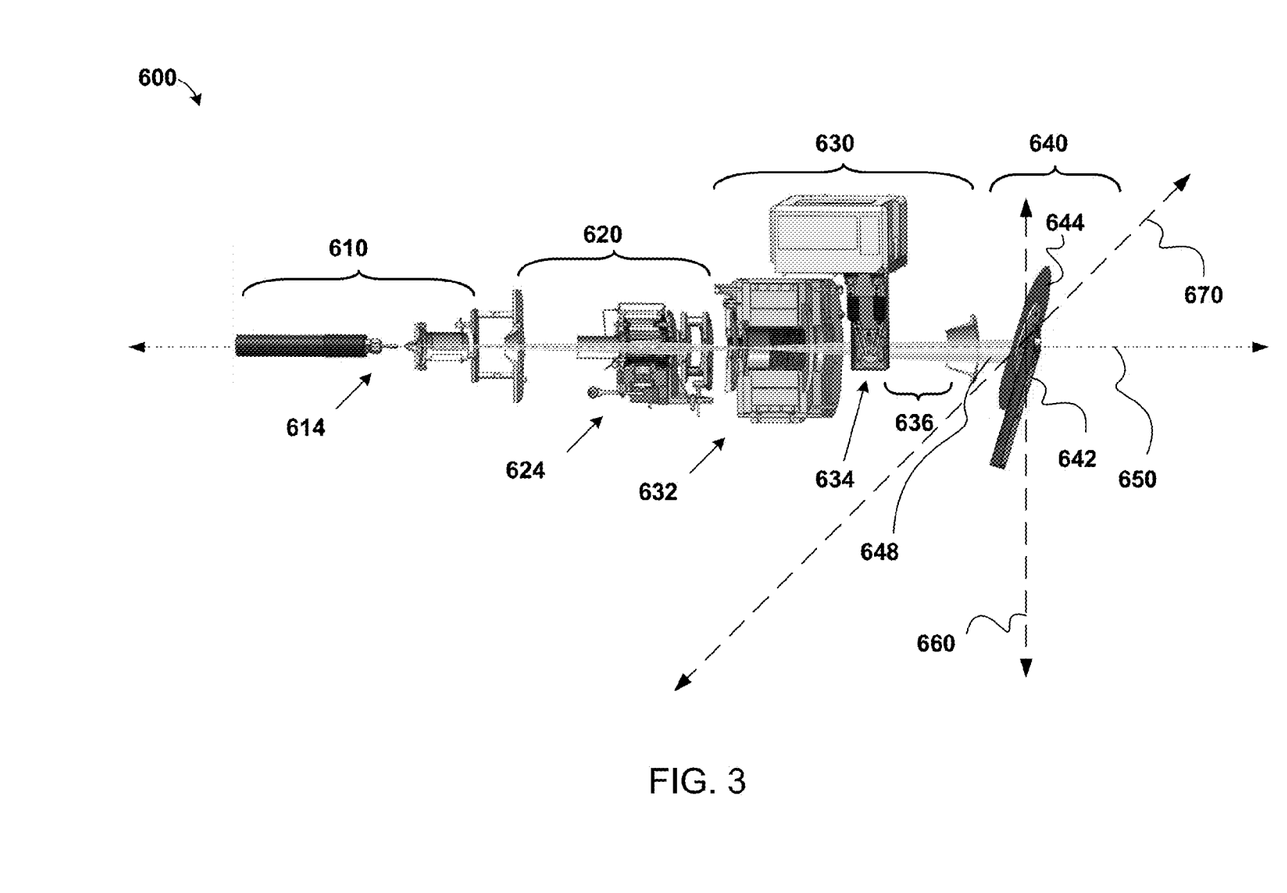
FIG. 3 depicts components of a gas cluster ion beam (GCIB) device, according to an embodiment of the invention.

FIG. 3 depicts an angular gas cluster ion beam (GCIB) system 600 for depositing first and second portions of a spacer layer onto, and for doping portions of a spacer film layer from, semiconductor device 100 (FIGS. 1A-F) and finFET 200 of FIGS. 2A-F, according to an embodiment of the invention.

A gas cluster ion beam ("GCIB") system 600 according to an embodiment, comprises a multi-part cluster formation module 610 (generically referred to herein as a first module 610), including a nozzle 614 emitting gas clusters. The GCIB system 600 further comprises a beam formation module 620 (generically referred to herein as a second module 620) wherein the gas clusters from the gas cluster formation module 610 are ionized by using an ion source 624, and passed through to a beam modification module 630 (generically referred to herein as a third module 630) having a magnet 632 and a neutralizer 634, which accelerates the ionized gas clusters and neutralizes excess charge buildup within the GCIB system 600. The accelerated ion gas clusters are emitted and passed through a photovoltaic cell region 636 (which may be referred to as an emission point 636). The resulting ionized gas cluster beam 648 collides with a substrate 644 resting on or attached to a mechanically scanned platen 642. In a typical application of the GCIB system, the substrate 644 is a silicon wafer. The substrate 644 and the platen 642 reside in a target module 640 (generically referred to herein as a fourth module 640). The first, second, third and fourth modules may be positioned along a first horizontal x-axis 650.

According to a related aspect of the invention, the GCIB system 600 may include an oblique-angular application of the beam 648 to the substrate 644. The platen 642 may be positioned such that the substrate 644 intercepts the beam 648 at an oblique angle. The platen 642 and thereby the substrate 644 is positioned at an oblique angle from at least one of a vertical y-axis 660, the x-axis 650, or a second horizontal z-axis 670. The y-axis 660 and the z-axis 670 are substantially perpendicular from the horizontal axis 650 along the length of the GCIB modules 610, 620, 630, and 640. In related embodiments, the platen 642 or the substrate 644 may be fixed at an oblique angular position relative to the beam 648, or their angle may be adjustable along the xyz axes using a pivotable member (not shown), connected to the platen 642 to adjust the acute angle at which the substrate 644 intercepts the beam 648. For example, a ball joint connected to the platen 642 may enable x, y, and z adjustments, that is, along the axes 650, 660 and 670. The platen 642 and the substrate 644 are movable along each of the z and y axes 660 and 670.

According to a further embodiment of the disclosed invention, the platen 642 and/or the substrate 644 are additionally configured to move along the axis 650, towards or away from the beam 648 source (i.e., the third module 630), such that the center of the beam 648 collides with the surface of the substrate 644 at a configurable distance, preferably at a substantially equal distance for each portion of the substrate 644 that is scanned by the beam 648. Angularly positioning, i.e., tilting, the platen 642 and the substrate 644 results in one portion of the substrate 644 being closer to the beam 648 than an opposing end. With the beam 648 source being stationary, moving the platen 642 along the axes 660 or 670 (depending on the direction of the tilt) during the GCIB scan process may result in an increased distance between an emission point of the beam 648 from the third module 630 and the surface of the substrate 644 as the length of the substrate 644 is scanned. By allowing the platen 642 to move along the axis 650, therefore, the distance between the emission point of the beam 648 from the third module 630 and the surface of the substrate 644, is configurable, and can be maintained at a substantially constant value. For example, as the beam 648 is projected onto successively farther portions of the substrate 644, the platen 642 may be stepped forward, i.e., moved closer to the beam 648 source, to cancel out the added distance between the two. The reference point for this distance may be, for example, the center of the beam 648 at the point where it collides with the substrate 644.

In a related embodiment, the emission point 636 of the third module 630 is mechanically movable along the axis 650, such that it allows adjustment of the distance traveled by the beam 648 before it is intercepted by the substrate 644. This feature allows the GCIB system 600 to maintain an equal distance between the emission point 636 of the beam 648 and the point of contact on the substrate 644 (measured, for example, at the center of the beam at the point of contact), or to vary the distance in a controlled way.

A given portions(s) of the substrate 644 may be scanned multiple times with varying intensity to achieve a desired level of surface manipulation, such as substantially uniform manipulation. Additionally, the speed at which the platen 642 is moved may be changed to further facilitate this objective.

Using the GCIB system 600, it is possible to treat the surface of the substrate 644 including, for example, semiconductor device 100 and finFET 200 (FIGS. 1A-F and FIGS. 2A-F, respectively), by depositing a spacer layer, or doping portions thereof once it has been deposited independently of the method of deposition.

The GCIB system 600 provides for versatile techniques because it can be used with virtually any gas, with varying intensity. Among other applications, it can be used for deposition, etching, and doping steps in the microelectronics fabrication processes. Unlike ion beam milling techniques, the etching process in GCIB is predominantly chemical and can affect removal of shallow films without damage to underlying material. Properties of the beam 648, such as beam size, the number of times it passes over an area of the substrate 644, and related factors depend on the particular application. In embodiment, the substrate 644 is a semiconductor wafer having, for example, a 300 mm diameter. The beam 648 spot size, i.e., the point where it is intercepted by the substrate 644, may be defined by a Gaussian distribution of clusters with full width half maximum of approximately 1 cm in diameter. The wafer may be scanned approximately 100 times from left to right, using an approximately 3 mm step, beginning at an upper side of the substrate 644. In an embodiment, the platen 642 is movable along a vertical axis 660 and a second horizontal axis 670 (corresponding to the y-axis and z-axis).

According to an embodiment of the invention, when forming the structures of FIGS. 1A-2F, the GCIB system may be configured such that the ion beam intercepts the platen at an angle of approximately 30 to 60 degrees.

What is claimed is:

1. A method for forming a semiconductor device, comprising:
    forming first and second gate stacks on an upper surface of a substrate, whereby the first and second gate stacks are formed in parallel and are separated by an intermediate region;
    depositing a dielectric layer on an upper surface of the first and second gate stacks, whereby the dielectric layer comprises a trench region above at least a portion of the intermediate region, wherein the trench region includes first and second parallel sidewalls, parallel to the first and second gate stacks, and third and fourth parallel sidewalls, perpendicular to the first and second gate stacks;
    depositing a silicide layer within a bottom portion of the trench region; and depositing, by an angular gas cluster ion beam device, a spacer layer within at least the first and second portions of the trench region above and in direct contact with portions of the silicide layer, wherein sidewalls of the first portion of the trench region comprise portions of the first, second, and third sidewalls of the trench region, and wherein sidewalls of the second portion of the trench region comprise portions of the first, second and fourth sidewalls of the trench region.

2. The method of claim 1, wherein depositing the spacer layer further comprises:
positioning the semiconductor device at a non-perpendicular angle relative to an emission point of the GCIB device;
depositing the spacer layer, by the GCIB device, onto at least the first portion of the trench region;
rotating the semiconductor device by 180 degrees;
depositing the spacer layer, by the GCIB device, onto at least the second portion of the trench region; and
removing the spacer layer from a central portion of the trench region, whereby the spacer layer remains on the first and second portions of the trench region.

3. The method of claim 2, wherein removing the spacer layer from a central portion of the trench region is performed using reactive ion etching (RIE).

4. The method of claim 1, further comprising:
forming at least two fins onto the upper surface of the semiconductor device prior to depositing the dielectric layer, wherein the first portion of the trench region includes a sidewall corresponding to a sidewall of the at least two fins, and wherein the second portion of the trench region includes a sidewall corresponding to another sidewall of the at least two fins, and
wherein the silicide layer is formed above at least an upper surfaces of the at least two fins.

5. The method of claim 1, wherein the spacer layer has a thickness of approximately 10 nm.

6. The method of claim 1, wherein a critical dimension of the first and second gate stacks is approximately 20 nm.

7. The method of claim 1, wherein the trench region has a height of approximately 15 nm to approximately 25 nm.

8. The method of claim 2, wherein the non-perpendicular angle is between 30 and 60 degrees.

9. A method for forming a semiconductor device, comprising:
forming first and second gate stacks on an upper surface of a substrate, whereby the first and second gate stacks are formed in parallel and are separated by an intermediate region;
depositing a dielectric layer on an upper surface of the first and second gate stacks, whereby the dielectric layer comprises a trench region above at least a portion of the intermediate region, wherein the trench region includes first and second parallel sidewalls, parallel to the first and second gate stacks, and third and fourth parallel sidewalls, perpendicular to the first and second gate stacks;
depositing a silicide layer within a bottom portion of the trench region; and
depositing a conformal spacer layer on an upper surface of the semiconductor device including upper surfaces of the dielectric layer and the trench region;
doping the spacer layer in the first and second portions of the trench region with retardant gas ions using an angular gas cluster ion beam (GCIB) device,
wherein sidewalls of the first portion of the trench region comprise portions of the first, second, and third sidewalls of the trench region, and
wherein sidewalls of the second portion of the trench region comprise portions of the first, second and fourth sidewalls of the trench region.

10. The method of claim 9, further comprising:
removing the spacer layer from a central portion of the trench region, whereby the spacer layer remains in the first and second portions of the trench region.

11. The method of claim 9, wherein the retardant gas includes ion clusters of one or more of carbon and fluorine gas.

12. The method of claim 10, wherein removing the spacer layer from a central portion of the trench region comprises using a reactive ion etching (RIE) process.

13. The method of claim 9, further comprising:
forming at least two fins onto the upper surface of the semiconductor device prior to depositing the dielectric layer, wherein the first portion of the trench region includes a sidewall corresponding to a sidewall of the at least two fins, and wherein the second portion of the trench region includes a sidewall corresponding to another sidewall of the at least two fins, and
wherein the silicide layer is formed above at least an upper surface of the at least two fins.

14. The method of claim 9, wherein a critical dimension of the first and second gate stacks is approximately 20 nm.

15. The method of claim 9, wherein the trench region has a height of approximately 15 nm to approximately 25 nm.

16. The method of claim 9, wherein doping the spacer layer further comprises:
positioning the semiconductor device at a non-perpendicular angle relative to an emission point of the GCIB device;
doping the spacer layer, by the GCIB device, on at least the first portion of the trench region;
rotating the semiconductor device by 180 degrees; and
doping the spacer layer, by the GCIB device, on at least the second portion of the trench region.

* * * * *